United States Patent [19]
Mickelson et al.

[11] Patent Number: 4,694,488
[45] Date of Patent: Sep. 15, 1987

[54] DISTRIBUTING FRAME FOR TELECOMMUNICATIONS CIRCUITS

[75] Inventors: Nils P. Mickelson, Gorham, Me.; Jerauld C. MacFarlane, Hurst, Tex.

[73] Assignee: GTE Products Corporation, Stamford, Conn.

[21] Appl. No.: 906,878

[22] Filed: Sep. 15, 1986

[51] Int. Cl.$^4$ .............................................. H05K 7/18
[52] U.S. Cl. .................................... 379/327; 379/325; 379/326
[58] Field of Search ............... 379/327, 325, 326, 328, 379/330; 339/18 R, 18 B, 18 C, 18 P

[56] References Cited

U.S. PATENT DOCUMENTS

| | | | |
|---|---|---|---|
| 2,098,321 | 11/1937 | Treptow | 379/327 |
| 2,512,908 | 6/1950 | Arndt | 379/328 |
| 4,002,856 | 1/1977 | Sedlacek | 379/328 |
| 4,313,039 | 1/1982 | DeLuca et al. | 379/327 |

*Primary Examiner*—Gene Z. Rubinson
*Assistant Examiner*—Lawrence L. Fess
*Attorney, Agent, or Firm*—James Theodosopoulos

[57] ABSTRACT

The present invention involves a modular distributing frame assembly for distributing telephone circuits. It includes a central office bay member which has a generally vertical hollow member with forward and rear surfaces. The forward surface has a plurality of alternating terminal blocks and interstices. Each terminal block communicates with the rear surface and provides appearances for office cables. The rear surface defines a vertical opening adapted to receive the office cables. The frame also includes an outside plant bay member with a generally vertical hollow member with forward and rear surfaces. The forward surface has a plurality of alternate terminal blocks and interstices. Each of the terminal blocks provides appearances for subscriber cables. The rear surface defines a vertical opening with a plurality of connector blocks mounted therein. The frame also includes a trough member with a vertical partition member positioned adjacent each of the bay members and providing a vertical channel for conducting selected cables to the connector blocks of adjacent bay members and for vertical routing of jumper wires between terminal blocks.

9 Claims, 3 Drawing Figures

DISTRIBUTING FRAME FOR TELECOMMUNICATIONS CIRCUITS

FIELD OF THE INVENTION

The present invention relates to the field of telephony, and more particularly to a new and improved modular type of distributing frame structure wherein the components can be configured to a wide variety of installation requirements.

DESCRIPTION OF THE PRIOR ART

Distributing frames are well known in the art and generally are adapted for use in conjunction with equipment found in a telephone distribution center. The distributing frame equipment serves as an interface between the switching equipment (the inside plant or central office equipment) and the cable network of subscriber lines (the outside plant). Most frames feature a skeletonized frame adapted to support various types of connector blocks which provide termination appearances for the cable pairs, together with accompanying blocks for the termination of conductors leading to inside plant equipment. Removable jumper wires are used to interconnect the two, and more or less space utilization is made depending upon effectiveness of frame geometry. Examples of such prior art designs are disclosed in the following U.S. patents:

U.S. Pat. No. 2,098,321 to Treplow: Nov. 9, 1937;
U.S. Pat. No. 3,518,611 to Shores, Jr.: June 30, 1970;
U.S. Pat. No. 3,611,268 to Webb: Oct. 5, 1971;
U.S. Pat. No. 3,711,053 to Drake: Jan. 16, 1971;
U.S. Pat. No. 3,781,758 to Anderson: Dec. 25, 1971.

With the constant growth of the number of subscribers, the problem of accommodation of ever-growing connector pairs for a given telephone office required frames adapted to provide high space utilization with maximum pair density. In an effort to overcome this burgeoning demand, modular distributing frame assemblies were developed which employed consolidated designs with portions pre-wired in an effort to optimize use of floor space while reducing installation time. Examples of such prior art designs are disclosed in the following U.S. Patents:

U.S. Pat. No. 4,002,856 to Sedlacek: Jan. 11, 1977;
U.S. Pat. No. 4,117,273 to Gautier: Sept. 26, 1978;
U.S. Pat. No. 4,204,095 to DeLuca: May 20, 1980;
U.S. Pat. No. 4,313,039 to DeLuca: Jan. 26, 1982.

While the prior art provided improvements in the areas intended, there is still a great need for distributing frames which are economically adaptable for use in smaller installations while providing the ability to be easily reconfigured to accommodate various installation needs. The advantages of digitally controlled telephone systems and the resultant use of digital switching equipment has lead to the use of many small satellite switching installations remotely located from the central office. Such installations require distributing frames which are economically used in such smaller installations while being adaptable to the wide variety of configurations required by such satellite installations. One of the prime disadvantages of the frames of the prior art is that they do not serve such needs.

Accordingly, an object of the present invention is to provide a new and improved distributing frame for telecommunications circuits which is economically employed in smaller installations.

Another object of the present invention is to provide a modular distributing frame which can be assembled to configurations which serve a variety of installation needs.

A still further object of the present invention is to provide a distributing frame wherein the grounding circuit may be electrically isolated from the metal of the frame thereby reducing or eliminating the possibility of spurious voltages and currents known as "ground loops".

SUMMARY OF THE INVENTION

Briefly stated, the invention contemplates the provision of a new and improved distributing frame construction in which the disadvantages of the prior art have been substantially eliminated. The disclosed emobidment is comprised of three main components and ancillary components for completing the desired installation configuration. The components are assembled in sequence to form a frame structure of desired capacity. The basic frame assembly comprises an outside plant (OSP) bay which provides for mounting of surge protectors as well as connector blocks for connection to outside cables (subscriber lines) on one side and terminal blocks on the other side which provide termination appearances for the subscriber pairs; a central office equipment (COE) bay with corresponding terminal blocks which provide termination appearances for switching and related office equipment; and a vertical wiring trough member which provides a channel for cables to enter, feed through and "fan out" in the distributing frame on the protector side, while providing on the terminal block side of the distributing frame a channel along which jumper wires pass to interconnect the terminal blocks of the OSP bays with the corresponding terminal blocks of the COE bays. By selecting an appropriate sequence of OSP and COE bays and vertical channel members, the distributing frame of the present invention can be uniquely assembled to accommodate a particular installation. With the distributing frame of the present invention, the grounding circuit is electrically isolated from the metal structure of the distributing frame, thereby eliminating "ground loops".

DESCRIPTION OF THE PREFERRED EMBODIMENTS

Figure 1:
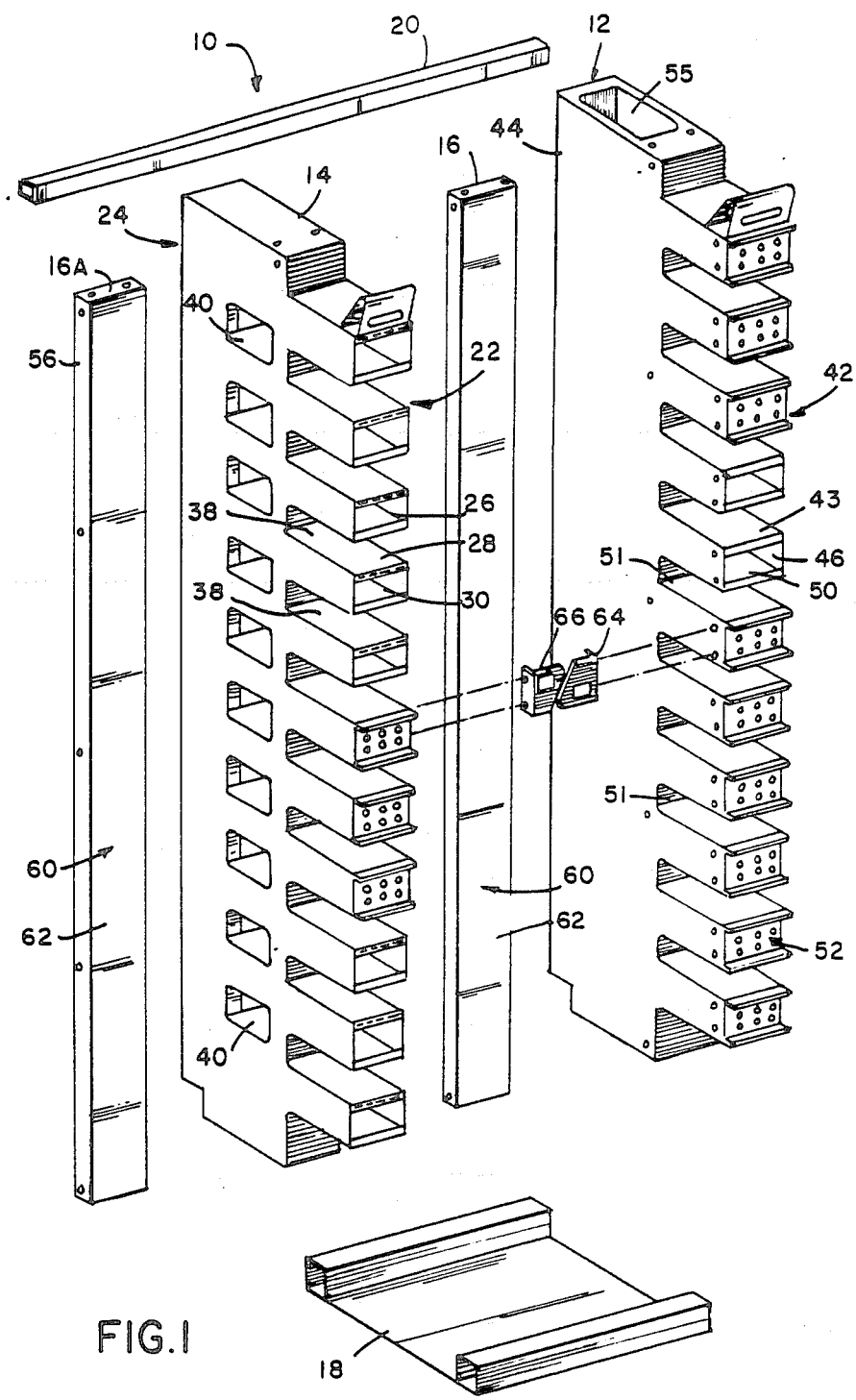
FIGS. 1 and 2 are exploded front and rear views respectively of an embodiment of the distributing frame of the present invention.

Referring now to the drawings, the distributing frame generally indicated by the reference character 10, comprises a central office equipment (COE) bay 12, and outside plant (OSP) bay 14, vertical wiring troughs 16 and 16A, base support member 18 and channel member 20.

In order to maintain clarity of the drawings, the wiring of the distributing frame which is well known to those skilled in the art has been omitted.

The OSP bay 14 interconnects with outside cables, for example, incoming subscriber cables or trunk cables and includes a front side 22 and a rear side 24. The front side 22 includes a plurality of hollow chamber members 26, each including an upper wall 28 and a lower wall 30, within which individual terminal blocks 32 are mounted. The rear side 24 of the OSP bay provides a connector section 34 having a plurality of connector blocks 36 constructed arranged to receive plug-in protector assemblies or modules (not shown) which serve to connect pairs of incoming lines as well as to provide protection for the switching equipment against spurious high voltages and current surges that might occur on the incoming lines, all as is well known in the art. The walls 28 and 30 define horizontal spaces or interstices 38 which serve to orient and channel jumper wires as discussed hereinafter.

Adjacent the rear side 24 of the OSP bay, there is provided a vertical column of apertures 40 which serve as entrances for subscriber cables connected to connector blocks 36. These cables enter the frame vertically in the channel formed by the vertical wiring troughs 16 and fan out horizontally through apertures 40 to the connector blocks 36.

The COE bay 12 interconnects with switching and related office equipment, and includes front side 42 and a rear side 44. The front side 42 includes a plurality of hollow chamber members 46, each including an upper wall 48 and a lower wall 50, within which individual terminal blocks 52 are mounted. The terminal blocks 52 provide termination apperances for switching and related office equipment cables. The walls 48 and 50 define horizontal spaces or interstices 51 which correspond with spaces 38 and serve to orient and channel jumper wires as discussed later. The reverse side 44 of COE bay 12 is provided with a vertical opening 54 to receive the cables for the switching and office related equipment which enter through aperture 55 and make their appearances at terminal blocks 52.

The vertical wiring trough members 16 and 16A are the same in construction. The rear side 56 of the vertical trough provides a vertical surface 58 which serves as a vertical pathway for cables to enter and fan out to OSP bays. For example, the incoming subscriber cables would be conducted through channel 58 of vertical trough member 16 and would fan out to make appearances at the appropriate connector blocks 36 of the OSP bay and corresponding terminal blocks 32. The front side 60 of the vertical troughs provides a vertical surface 62 which serves as a vertical pathway for jumper wires which connect OSP bay terminal blocks with COE bay terminal blocks. For example, a trough or channel is formed between COE bay 12, adjacent OSP bay 14 and the interposed surface 62 of vertical trough member 16. It can be appreciated that the horizontal spaces 38 and 51 provide a plurality of horizontal channels to orient and channel individual or groups of jumper wires for cross connection. Similarly, the vertical pathway formed by the vertical troughs and adjacent COE and OSP bays form vertical channels which also serve to orient and channel jumper wires.

Suitable wire stays 64 and 66 can be attached to adjacent bay members 12 and 14 to provide for control of jumper wires which interconnect by terminal blocks. The diagonal space between stays 64 and 66 permits easy jumper installation.

Figure 2:
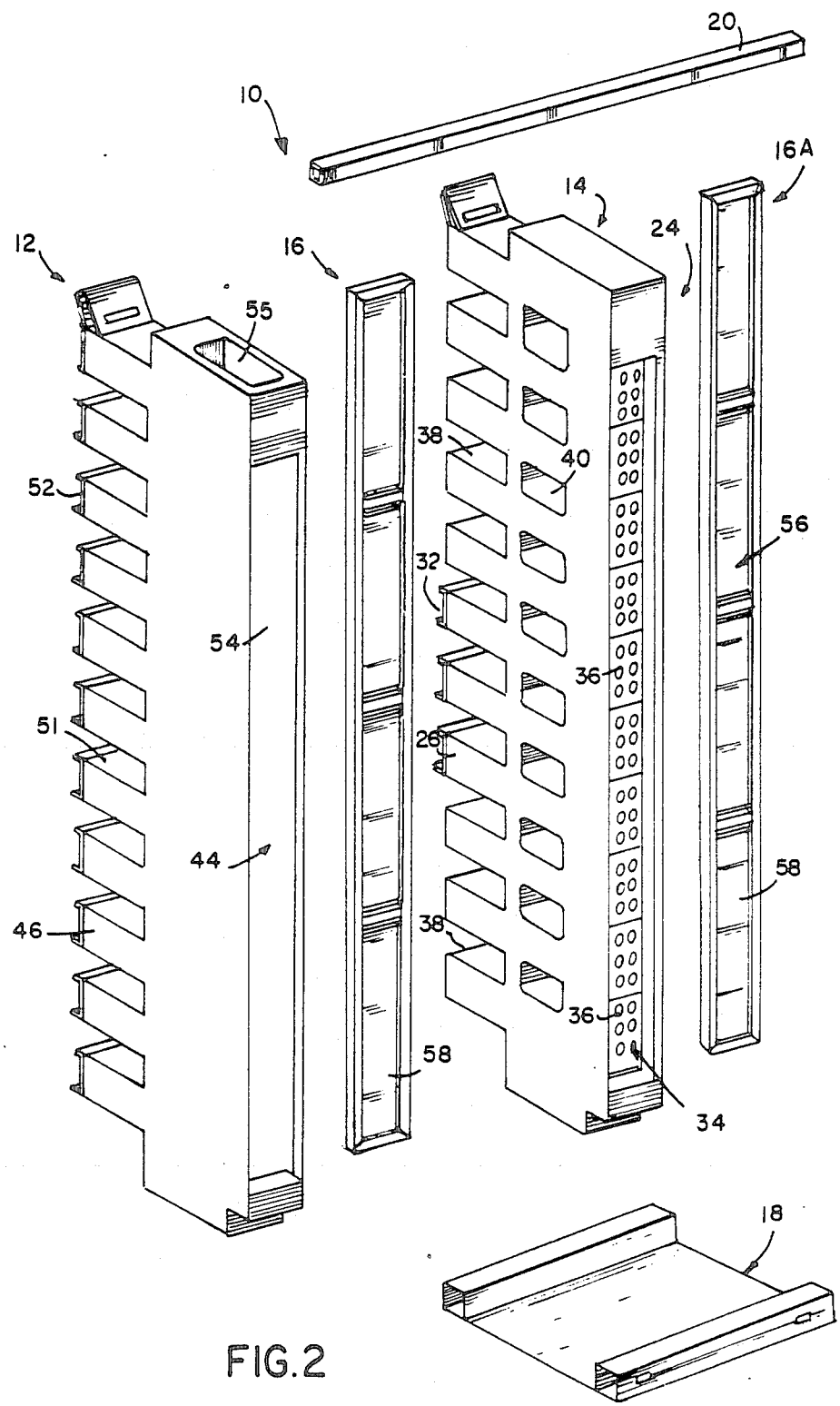
Figure 3:
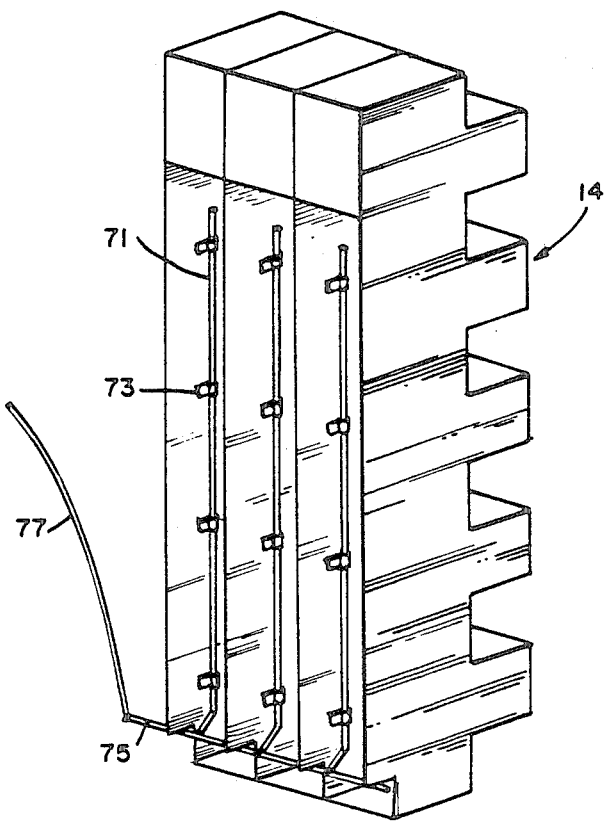
FIG. 3 is a rear elevational view of a preferred embodiment of the distributing frame of the present invention.

The particular distributing frame assembly of COE and OSP by frames separated by interdisposed vertical trough members can be disposed upon a suitable base unit 18 to form a modular unit assembly. Another feature of the distributing frame of the present invention is that the grounding circuit may be electrically isolated from the metal structure of the distributing frame, thereby eliminating spurious currents commonly known as "ground loops." In a preferred embodiment, the grounding system includes ground rods 71 mounted to the OSP bay 14 by electrically insulating clips 73. The collective current of all ground rods 71 is carried to a common ground bus 75 which runs horizontally through all OSP bays 14 to the building's ground wire 77. It is a feature of this invention that the ground rods 71 and ground bus 75 are never routed through a closed loop of conductive material (for example, a part of the frame structure). The rapid rate of current change which is typical of surge currents is easily impeded by eddy currents which may form in such a closed loop, and this must be prevented to assure proper circuit protection. Surge currents from the protector modules (not shown) pass through the connector blocks 36 (as shown in FIG. 2) to the ground rods 71 using conductors and terminations typical of conventional practice.

It can thus be seen that the present invention provides a novel and highly useful improvement in distributing frame construction, in which owing to the design of the OSP and COE bays, separated by the vertical troughs, the distributing frame assemblies can be uniquely tailored to any particular installation requirements.

It is apparent to those skilled in the art that changes and modifications may be made without departing from the scope of the invention herein involved in its broader aspects. Accordingly, it is intended that all matter contained in the above description, or shown in the accompanying drawings shall be interpreted as illustrative and not in a limiting sense.

As our invention, we claim:

1. A modular distributing frame assembly for distributing telephone circuits comprising:
   a central office bay member comprising a generally vertical hollow member having generally forward and rear surfaces, said forward surface having a plurality of alternating terminal blocks and interstices, each said terminal block communicating with said rear surface and providing termination appearances for office cables, said rear surface defining a vertical opening adapted to receive said office cables;
   an outside plant bay member comprising a generally vertical hollow member having generally forward and rear surfaces, said forward surface having a plurality of alternate terminal blocks and interstices, each of said terminal blocks providing termination appearances for subscriber cables, said rear surface having a plurality of connector blocks mounted thereon, means connecting said connector blocks with said subscriber cables and said terminal blocks; and
   a vertical trough member comprising a generally vertical partition member positioned adjacent each of said bay members, said vertical trough member providing a vertical channel for conducting selected cables and wires.

2. A modular distributing frame assembly for distributing telephone circuits in accordance with claim 1 wherein said outside plant bay member further includes protector modules interconnected to said connector blocks and means for connecting said protector modules to said subscriber cables.

3. A modular distributing frame assembly for distributing telephone circuits in accordance with claim 1 further including interconnecting means for connector blocks with said terminal blocks.

4. A modular distributing frame assembly for distributing telephone circuits in accordance with claim 1 further including interconnecting means for interconnecting selected terminal block appearances for subscriber cables with selected terminal block appearances for office cables.

5. A modular distributing frame assembly for distributing telephone circuits in accordance with claim 1 wherein said interstices of said central office and outside plant bay members are horizontally aligned thereby forming a plurality of horizontal columns for receiving jumper wires therein.

6. A modular distributing frame assembly for distributing telephone circuits comprising:
   a central office bay member comprising a generally vertical hollow member having generally forward and rear surfaces, said forward surface having a plurality of alternating openings and interstices, each said opening communicating with said rear surface and having a terminal block mounted therein to provide appearances for office cables; said rear surface defining a vertical opening communicating with said forward openings and adapted to receive said office cables;
   an outside plant bay member comprising a generally vertical hollow member having generally forward and rear surfaces, said forward surface having a plurality of alternate openings and interstices, each of said openings communicating with said rear surface and having a terminal block mounted therein to provide appearances for subscriber cables, said rear surface defining a vertical opening, having connector blocks mounted therein; and
   a vertical trough member comprising a generally vertical partition member having generally forward and rear surfaces, said rear surface providing a vertical channel for cables to enter and fan out to the connector blocks of an adjacent bay member.

7. A modular distributing frame assembly for distributing telephone circuits in accordance with claim 6, wherein the forward surface of said vertical trough member provides a vertical open channel for receiving jumper wires therein.

8. A modular distributing frame assembly for distributing telephone circuits in accordance with claim 6, wherein said bay members further include a vertical array of apertures positioned between said vertical trough and said rear surface to thereby provide a conduit for receiving subscriber cables.

9. A modular distributing frame assembly for distributing telephone circuits comprising:
   a central office bay member comprising a generally vertical hollow member having generally forward and rear surfaces, said forward surface having a plurality of alternating openings and interstices, each said opening communicating with said rear surface and having a terminal block mounted therein to provide appearances for office cables; said rear surface defining a vertical opening communicating with said forward openings and adapted to receive said office cables;
   an outside plant bay member comprising a generally vertical hollow member having generally forward and rear surfaces, said forward surface having a plurality of openings communicating with said rear surface, each of said openings having a terminal block mounted therein to provide appearances for subscriber cables, said rear surface defining a vertical of opening, having connector blocks mounted therein, each said connector block being electrically associated with an adjacent terminal block; said interstices of said central office and outside plant bay member forming a horizontal pathway whereby jumper connections may be formed; and
   a vertical trough member comprising a generally vertical partition member having generally forward and rear surfaces, said rear surface providing a vertical channel for cables to enter and fan out to the connector blocks of adjacent bay members, said forward vertical surface providing a pathway whereby vertical jumper connections may be routed.

* * * * *